United States Patent
Chang

[19]

[11] Patent Number: 5,891,785
[45] Date of Patent: Apr. 6, 1999

[54] PROCESS FOR FORMING SELF-ALIGNED SILICIDE

[75] Inventor: Ming-lun Chang, Hsinchu, Taiwan

[73] Assignee: Winbond Electronics Corp., Hsinchu, Taiwan

[21] Appl. No.: 886,776

[22] Filed: Jul. 1, 1997

[30] Foreign Application Priority Data

Jan. 15, 1997 [TW] Taiwan ................................. 86100380

[51] Int. Cl.⁶ .................................................. H01L 21/335
[52] U.S. Cl. ........................ 438/305; 438/592; 438/655; 438/683
[58] Field of Search ..................... 438/299, 301, 438/303, 305, 592, 655, 657, 682, 683; 257/384, 413

[56] References Cited

U.S. PATENT DOCUMENTS

| | | | |
|---|---|---|---|
| 4,587,718 | 5/1986 | Haken et al. | 438/297 |
| 4,740,484 | 4/1988 | Norstrom et al. | 438/586 |
| 4,877,755 | 10/1989 | Rodder | 438/586 |
| 5,027,185 | 6/1991 | Liauh | 257/413 |
| 5,034,348 | 7/1991 | Hartswick et al. | 438/453 |
| 5,268,330 | 12/1993 | Givens et al. | 438/586 |
| 5,322,809 | 6/1994 | Moslehi | 438/303 |

*Primary Examiner*—T. N. Quach
*Attorney, Agent, or Firm*—Ladas & Parry

[57] ABSTRACT

A process for forming self-aligned silicide which is suitable for high-integrity processes after applying planarization technology. The present invention can protect the self-aligned silicide from being over-etched during subsequent contact etching process by means of forming a thicker silicide layer on the positions with shallower contact windows. At first, a polysilicon layer and a titanium layer are suquentially formed on a substrate having a field oxide, and defined to form a gate in an active region and a polysilicon line on the field oxide with titanium thereon. Then, impurities are implanted to form an LDD, an insulating layer is deposited and etched back to form a sidewall spacer of the gate and polysilicon line, and source/ drain regions are formed on the sides of the gate. After source/drain regions are formed, another titanium layer is formed so that titanium on the gate and polysilicon line is thicker than that on other regions. Accordingly, self-aligned silicide can be achieved by activating the reaction of titanium and silicon and selectively removing unreacted titanium.

8 Claims, 9 Drawing Sheets

PROCESS FOR FORMING SELF-ALIGNED SILICIDE

BACKGROUND OF THE INVENTION

1. Field of the Invention

The present invention relates to a process for forming self-aligned silicide.

2. Description of the Prior Art

Figure 1A:
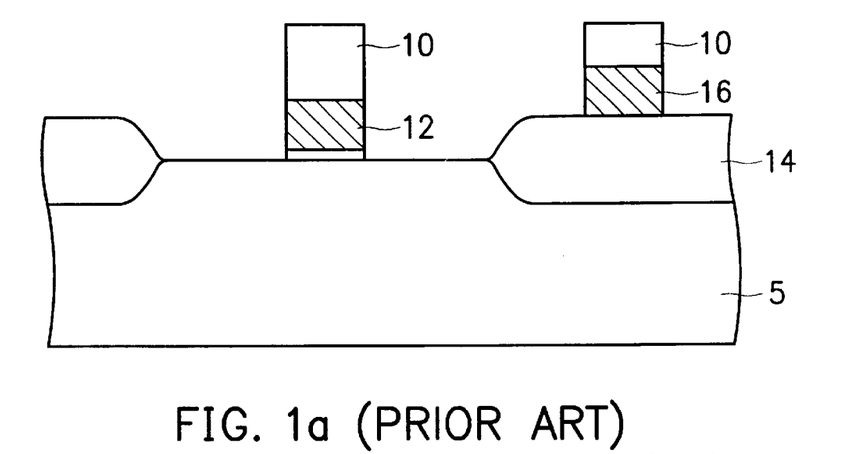
FIG. 1a to FIG. 1e (Prior Art) are diagrams for conventional self-aligned silicide processes.
Figure 1B:
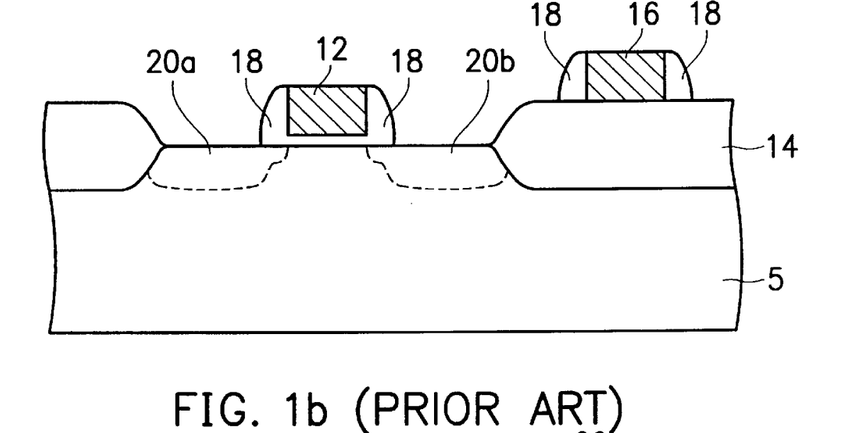
Figure 1C:
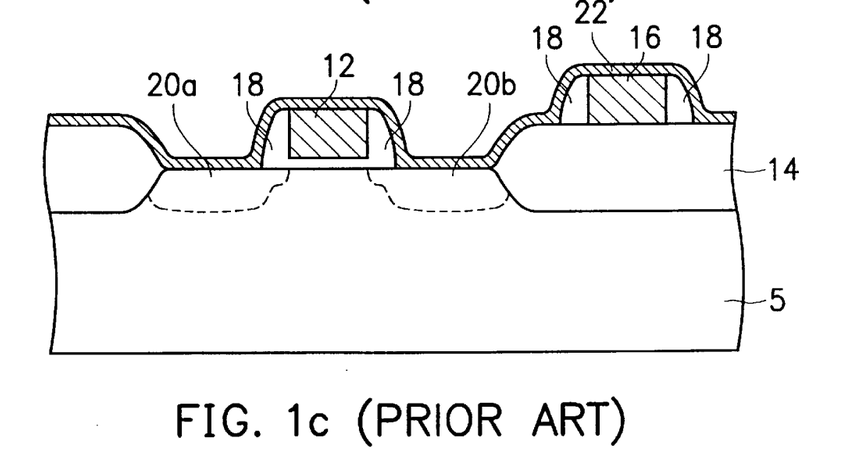
Figure 1D:
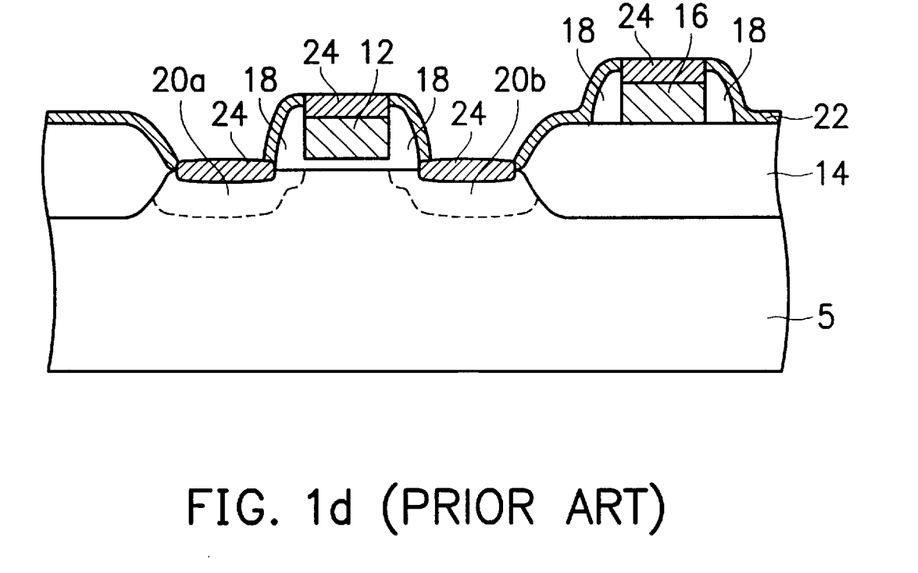
Figure 1E:
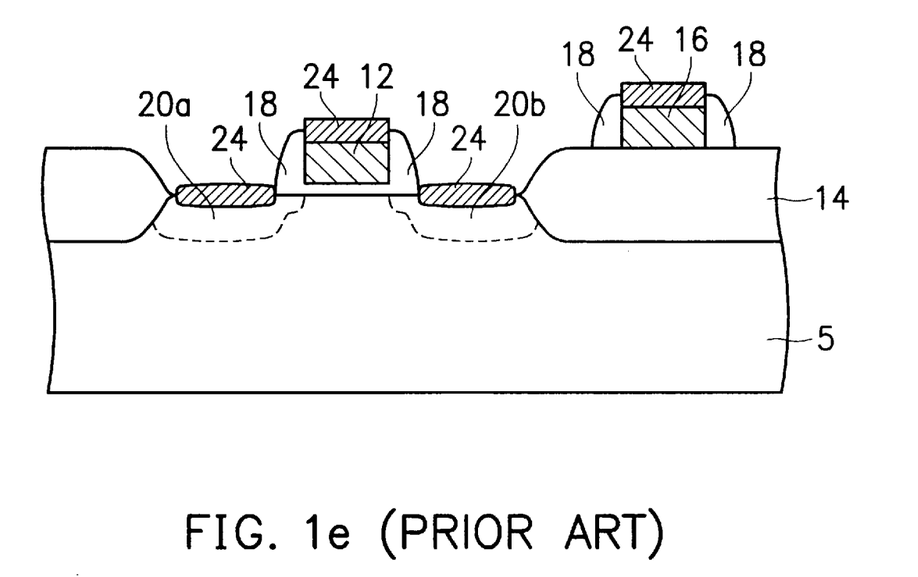

Generally speaking, the salicide process is one of the most widely-used technologies in sub-micron (0.5 um) semiconductors, and the titanium (Ti) salicide process is the most frequently-used salicide technology. Therefore, the following descriptions will concentrate primarily on titanium salicide technology. Referring to FIG. 1a to FIG. 1e (Prior Art), a conventional process for forming self-aligned titanium salicide is shown. In FIG. 1a, a polysilicon layer is formed on substrate 5. The polysilicon layer is then patterned and etched using photo-resist layer 10 in order to define gate 12 of a device in an active region, and to define polysilicon line 16 on field oxide 14. As shown in FIG. 1b, impurities are implanted to form an LDD structure, and a non-conducting layer deposited over substrate 5 and etched back to form sidewall spacer 18 of gate 12 and polysilicon line 16. Then impurities are implanted to form source 20a and drain 20b on the side of gate 12 in substrate 5. As shown in FIG. 1c, after source 20a and drain 20b are formed, metal layer 22 is formed by sputtering which can react with silicon to form a silicide. Referring to FIG. 1d, the reactions of sputtered metal layer 22 and the silicon material on substrate 5 are activated by a thermal process, e.g. a rapid thermal process (RTP), so that silicide layer 24 is formed on the surface of polysilicon line 16 and in the active region. As shown in FIG. 1e, the unreacted metal is selectively etched away, so that only silicide layer 24 remains. Then a thermal process is used in order to improve the structure of formed salicide layer 24, and to reduce the resistance.

With the shrinking of semiconductor device dimensions and the planarization techniques ,e.g., chemical mechanical polishing (CMP), introduced in the process of fabricating ICs, several restrictions have arisen in conventional salicide processes:

(1) Although the metalization of a polysilicon gate/line can reduce the sheet resistance of the device, the sheet resistance can not be minimized when the line width continues to narrow. Therefore, a approach to solve the problem involves increasing the thickness of the formed self-aligned silicide layer, that is, to increase the thickness of the metal layer sputtered over the wafer so that a thicker self-aligned silicide layer can be formed on the surface of the polysilicon line and in the active region. While this method indeed reduces the problem caused by the narrower line width, a leakage current is unexpectedly increased at the same time. Since a smaller device must have a shallower junction in order to form an active region, the thickness of the formed self-aligned silicide layer in the active region has to be properly controlled. On the average, the thickness of the formed self-aligned silicide is maintained at around one-half of the juction depth in order to prevent unexpected leakage currents. Accordingly, conventional salicide processes can not satisfy these requirements at the same time.

Figure 2:
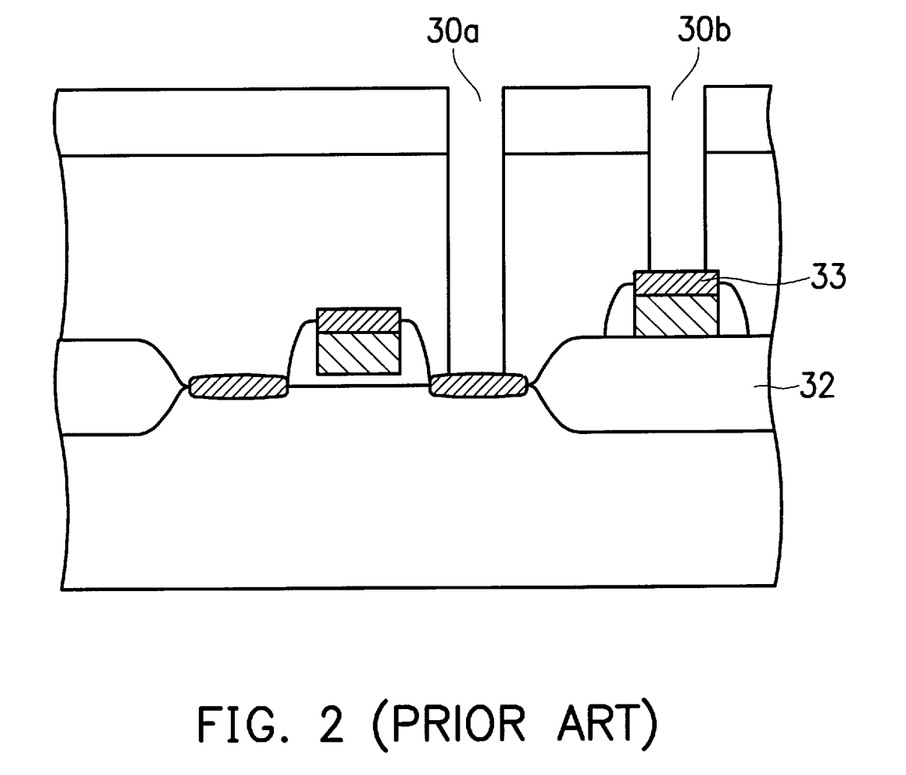
FIG. 2 (Prior Art) shows the different depths caused by applying a planarization process.

(2) Referring to FIG. 2(also Prior Art), because of the planarization techniques introduced into the process of IC production, especially CMP technology, the depths of the contact windows 30a and 30b will be quite different. In general, the polysilicon line regarded as an interconnect is often above field oxide 32. Therefore, the depth of contact window 30b is the shallower. The depth of contact window 30a is the deeper. The depth difference between the contact window 30a and 30b is about 2500 Å to 5000 Å. In this case, several problems will arise because of the different depths of the contact windows. When a process for contact etching is performed, because the depth of the contact windows 30b is shallower, the etching of the contact window 30b is first accomplished. At this time, the etching of the contact window 30a is not yet accomplished, so the etching process continues until the etching of the contact window 30a is also finished. However, long-term etching will cause the over-etching of the self-aligned silicide in contact window 30b. When the sputtered titanium is about 300 Å to 500 Å, the formed self-aligned silicide is about 660 Å to 1100 Å. Further, when a general dry etching process is applied, with the selectivity ratio of the inter-layer dielectric (ILD) and silicide within 10, self-aligned suicide layer 33 in the contact window 30b is at least 250 Å to 300 Å over-etched by the end of the etching of the contact window 30a. Accordingly, a method to reduce this problem involves determining a high selectivity ratio of the oxide and the silicide. However, it is not easy to acquire proper etching solutions with high selectivity ratios for polysilicon lines and the salicide layer on them.

SUMMARY OF THE INVENTION

Therefore, an object of the present invention is to provide a salicide process, which only increases the thickness of the silicide on the gate and on the polysilicon line, and does not increase the thickness of the silicide in the active region. Accordingly, the sheet resistance is reduced, and the junction leakage current remains at a low level. At the same time, the process window of the contact window etching is broadened.

In an embodiment of the present invention, a polysilicon layer and a titanium layer are suquentially formed on a substrate having a field oxide, and defined to form a gate in an active region and a polysilicon line on the field oxide with titanium thereon. Then, impurities are implanted to form an LDD, an insulating layer is deposited and etched back to form a sidewall spacer of the gate and polysilicon line, and source/drain regions are formed on the sides of the gate. After source/drain regions are formed, another titanium layer is formed so that titanium on the gate and polysilicon line is thicker than that on other regions. Accordingly self-aligned silicide can be achieved by activating the reaction of Tataium and silicon and thicker silicide layer can be formed on the gate and polysilicon line. Next, unreacted titanium can be removed by selectively used etching.

In another embodiment of the present invention, a polysilicon layer is first formed on a substrate having a field oxide, and patterned and etched to define a gate in an active region and a polysilicon line on the field oxide. Then, impurities are implanted to form an LDD, an insulating layer is deposited and etched back to form a sidewall spacer of the gate and polysilicon line, and source/drain regions are formed on the sides of the gate. After source/drain regions are formed, a first metal layer is defined to only cover the gate and polysilicon line. And a second metal layer is sputtered on the gate and polysilicon line so that the metal thereon is thicker than that on other regions. Accordingly, self-aligned silicide can be achieved by activating the reaction of titanium and silicon and selectively removing unreacted titanium.

In a third embodiment of the present invention, a polysilicon layer is first formed on a substrate having a field oxide, and patterned and etched to define a gate in an active region and a polysilicon line on a field oxide. Then, impurities are implanted to form an LDD, an insulating layer is deposited and etched back to form a sidewall spacer of the gate and polysilicon line, and source/drain regions are formed on the sides of the gate in the substrate. After source/drain regions are formed, a first metal layer is sputtered and reacted with silicon to form silicide. And self-aligned silicide is formed by reacting metal and silicon on the polysilicon line and in the active region and removing unreacted metal. Afterwards, a second metal layer is defined on the gate and polysilicon line with a space left on the corner of the surface of the gate and polysilicon line and reacted again with silicon so that the self-aligned silicide is formed with metal thicker on the gate and polisilicon line.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE PREFERRED EMBODIMENT

Figure 3A:
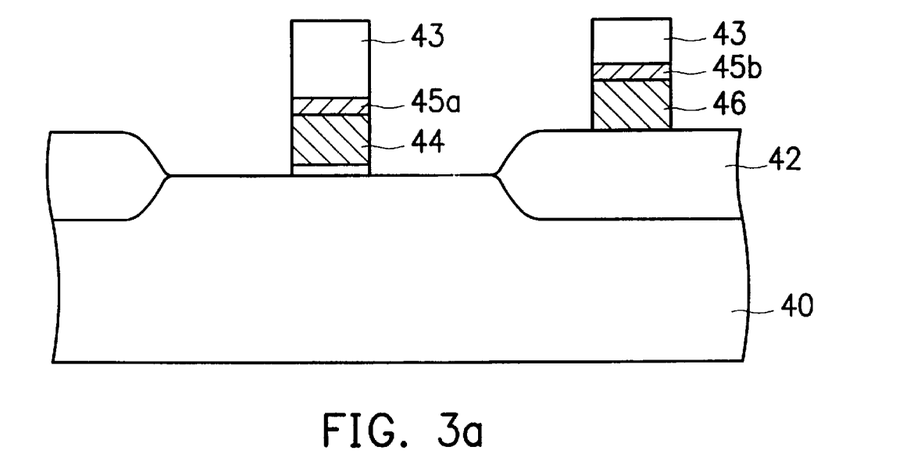
FIG. 3a to FIG. 3e are diagrams for a first embodiment of the present invention of a process for forming self-aligned silicide.
Figure 3B:
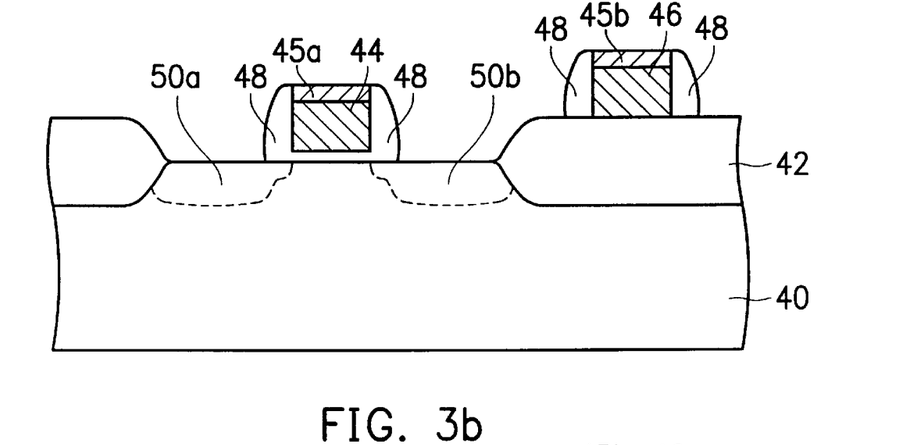
Figure 3C:
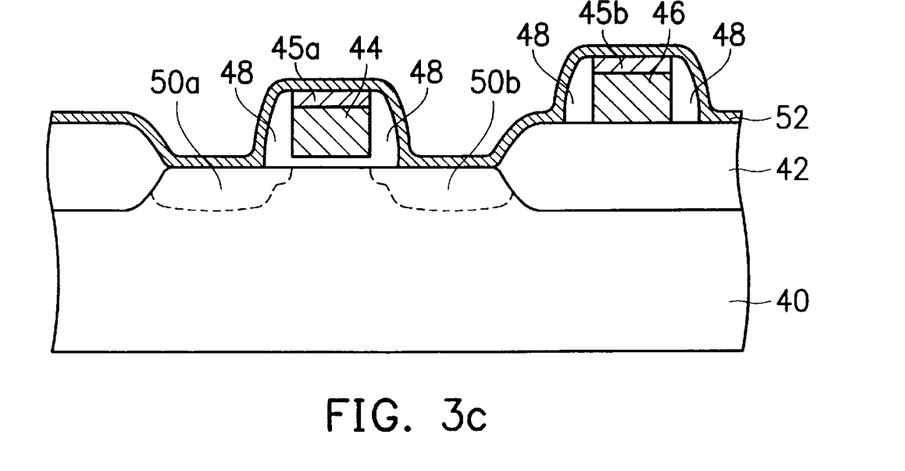
Figure 3D:
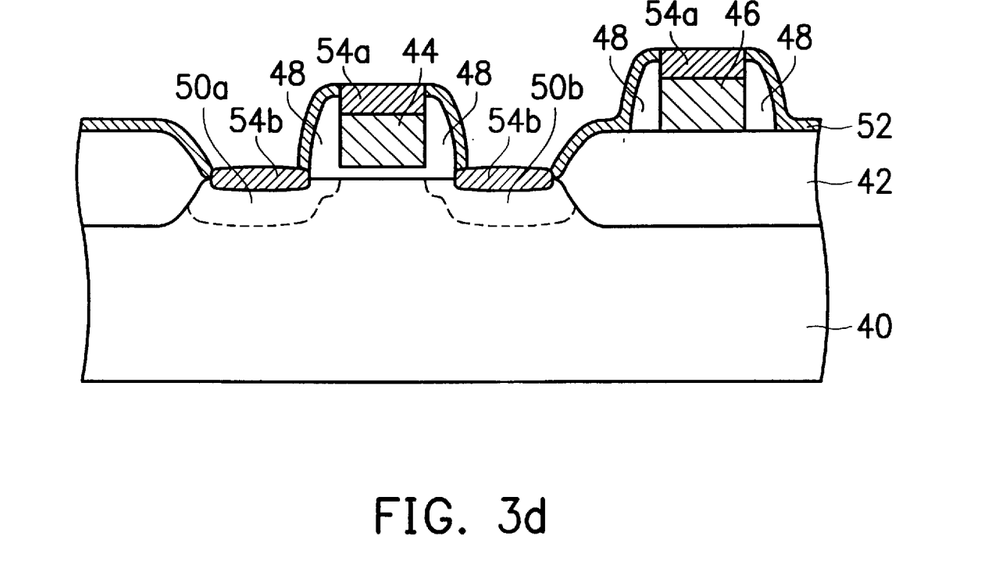
Figure 3E:
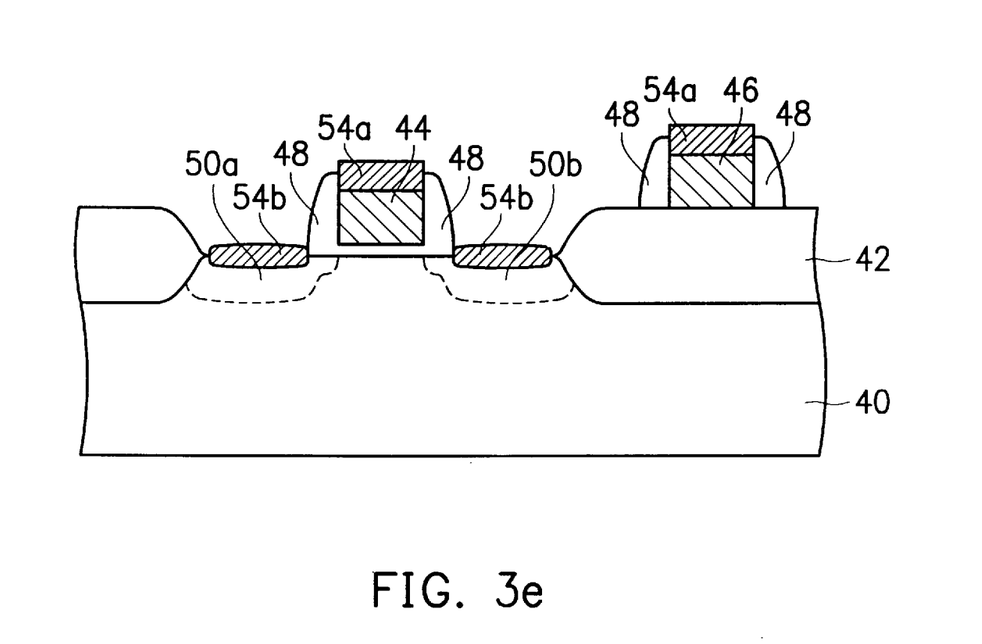

Referring to FIG. 3a to FIG. 3e, one embodiment of the present invention of a process for forming self-aligned silicide is depicted. Referring to FIG. 3a, a polysilicon layer and a titanium layer are sequentially formed on substrate 40 having field oxide 42. The polysilicon layer and the titanium layer are patterned and etched using photo-resist layer 43 to define gate 44 in an active region and polysilicon line 46 on field oxide 42. As shown in FIG. 3a, gate 44 and polysilicon line 46 are covered with titanium layer 45a and 45b. Referring to FIG. 3b, impurities are implanted to form an LDD structure. A non-conducting layer is deposited and etched back to form sidewall spacer 48 of polysilicon line 46 and gate 44. Impurities are then implanted to form source 50a and drain 50b on the side of gate 44 in substrate 40. As shown in FIG. 3c, after implanting to form source 50a and drain 50b, titanium layer 52 is formed on the wafer so that titanium layer on gate 44 and on polysilicon line 46 is thicker than that in the other regions. Referring to FIG. 3d, the reaction of titanium layer 52 and silicon is activated by a thermal process, e.g. a RTP process, so that silicide 54 is formed on gate 44, polysilicon line 46 and in the active region. As a result, the thickness of silicide 54a is thicker than the thickness of silicide 54b on drain 50a and source 50b in the active region. Referring to FIG. 3e, unreacted titanium is selectively etched away leaving only silicide 54a, 54b. Therefore, the self-aligned silicide produced using the present invention satisfies the requirements of the foregoing stated objectives while avoiding the over-etching of silicide 54a, 54b on the gate 44 and polysilicon line 46.

Figure 4A:
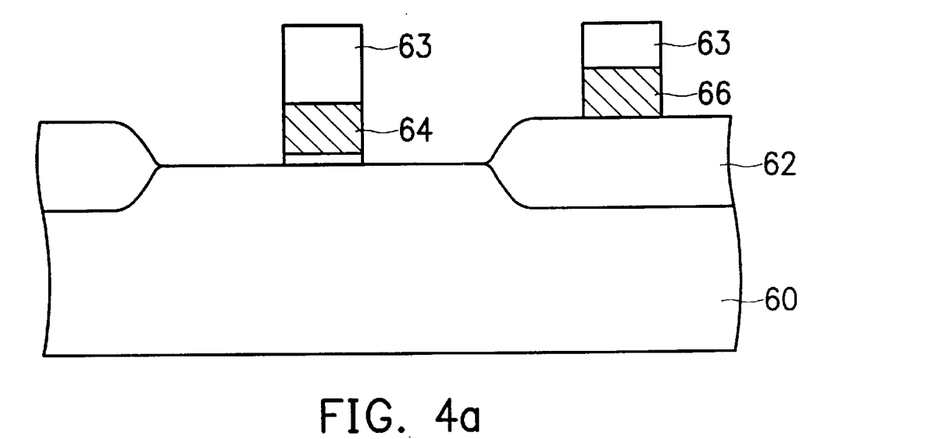
FIG. 4a to FIG. 4f are diagrams for a second embodiment of the present invention of a process for forming self-aligned silicide.
Figure 4B:
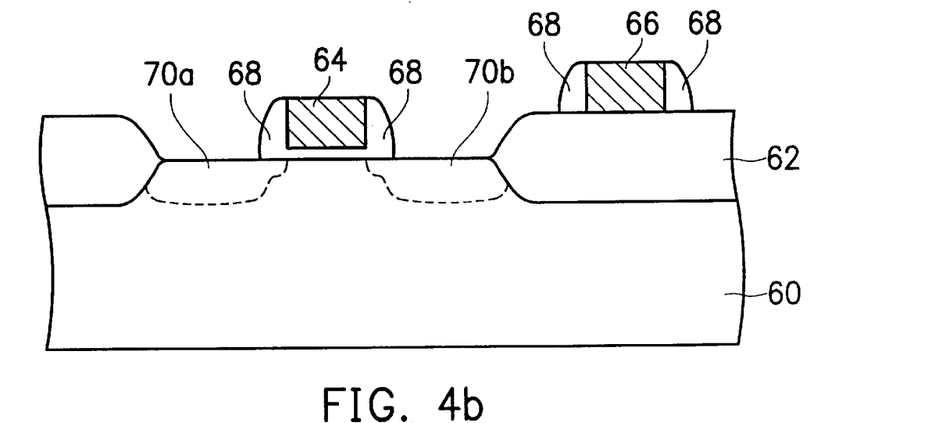
Figure 4C:
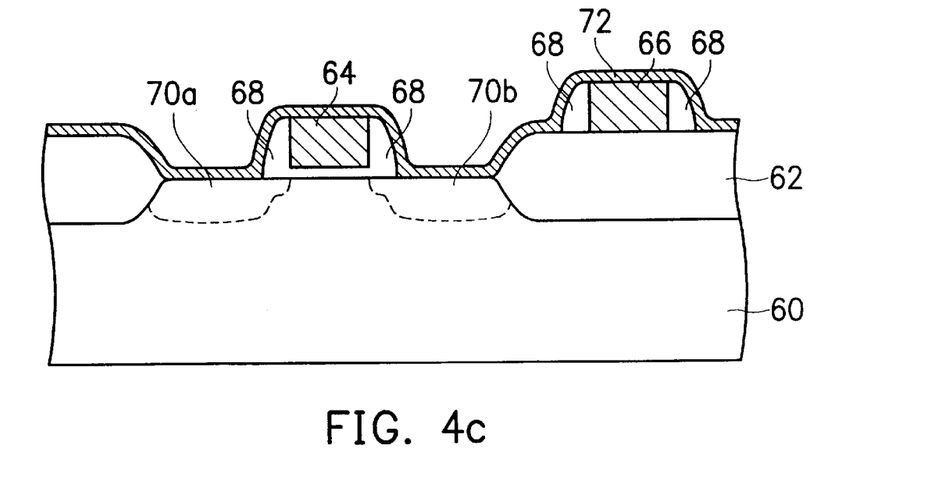
Figure 4D:
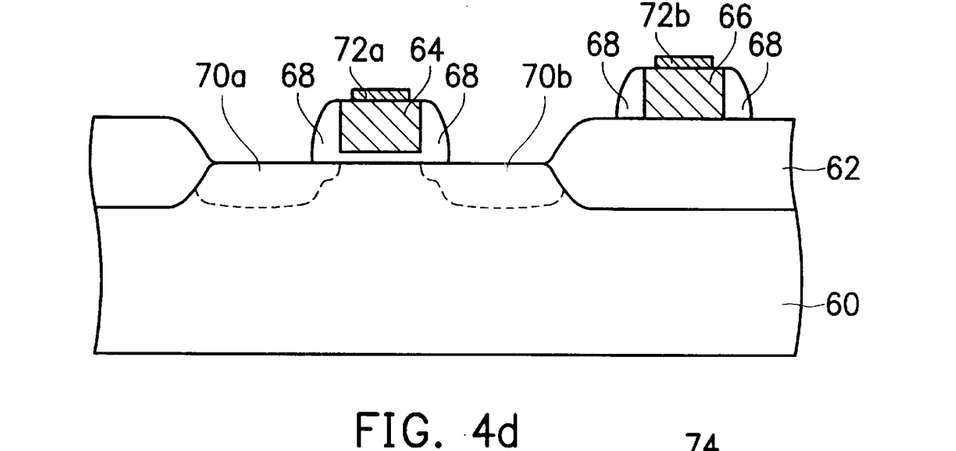
Figure 4E:
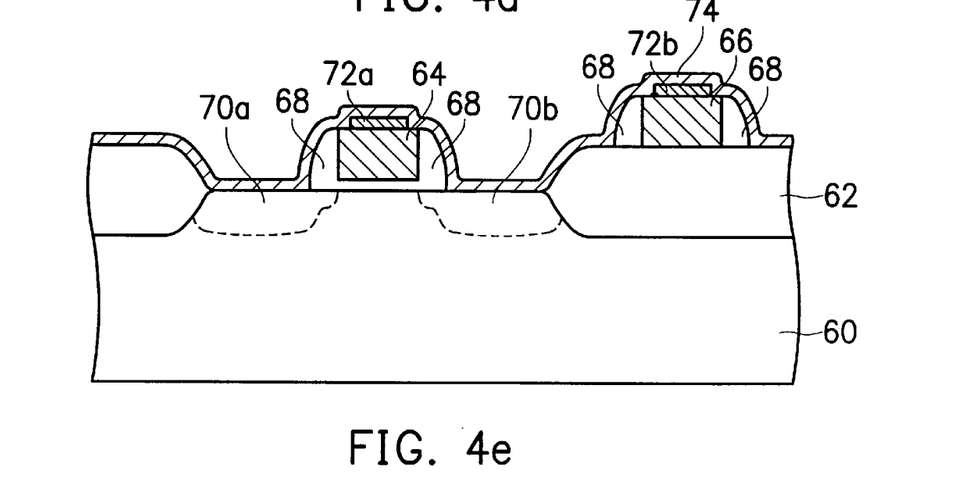
Figure 4F:
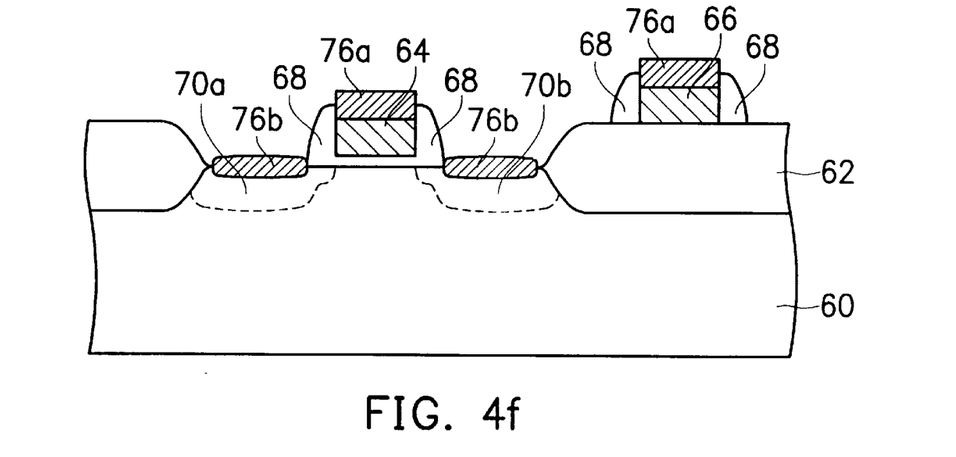

Referring to FIG. 4a to FIG. 4f, the objectives of the present invention can be achieved by another method. Referring to FIG. 4a, a polysilicon layer is formed on substrate 60 having field oxide 62. The polysilicon layer is then patterned and etched using photo-resist layer 63 in order to define gate 64 in an active region and polysilicon line 66 on field oxide 62. As shown in FIG. 4b, impurities are implanted to form an LDD structure. A non-conducting layer is deposited and etched back to form sidewall spacer 68 of polysilicon line 66 and gate 64 impurities are then implanted to form source 70a and drain 70b on the sides of gate 64 in substrate 60. As shown in FIG. 4c, after implanting to form source 70a and drain 70b, titanium layer 72 is formed on the wafer. As shown in FIG. 4d, titanium layer 72 is patterned the using another photo-resist layer to define titanium layer 72 on gate 64 and on polysilicon line 66. In this case, the mask of titanium layer 72 is a sized pattern of gate 64 and polysilicon line 66 pattern about 0.025 $\mu$m. Referring to FIG. 4e, titanium layer 74 is sputtered on the wafer so that the thickness of titanium on the gate and on the polysilicon line is thicker than the thickness of titanium in other regions. Referring to FIG. 4f, the reaction of the titanium layer 74 and silicon is activated by a thermal process, e.g. a RTP process, to form titanium silicide 76a and 76b on polysilicon line 66 and in the active region. As a result, the thickness of titanium salicide 76a on gate 64 and on polysilicon 66 will be greater than the thickness of titanium silicide layer 76b on drain 70a and 70b in the active region. Next, unreacted metal is selectively etched away leaving only silicide layer 76a and 76b.

Figure 5A:
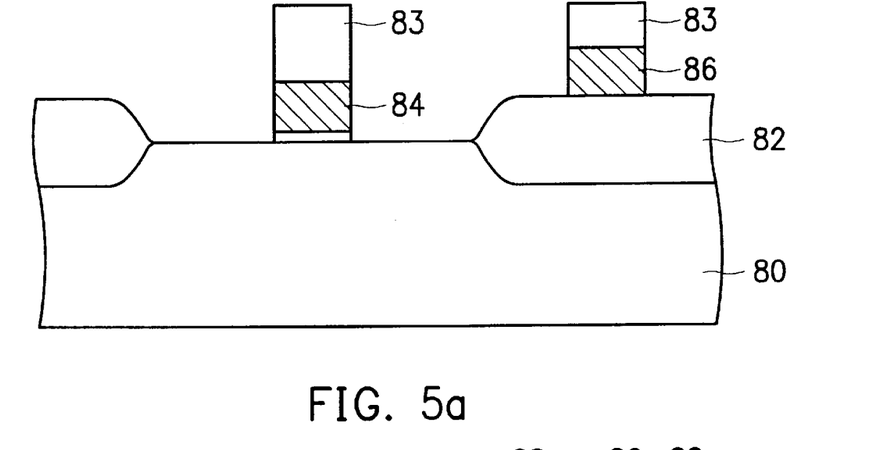
FIG. 5a to FIG. 5f are diagrams for a third embodiment of the present invention of a process for forming self-aligned silicide.
Figure 5B:
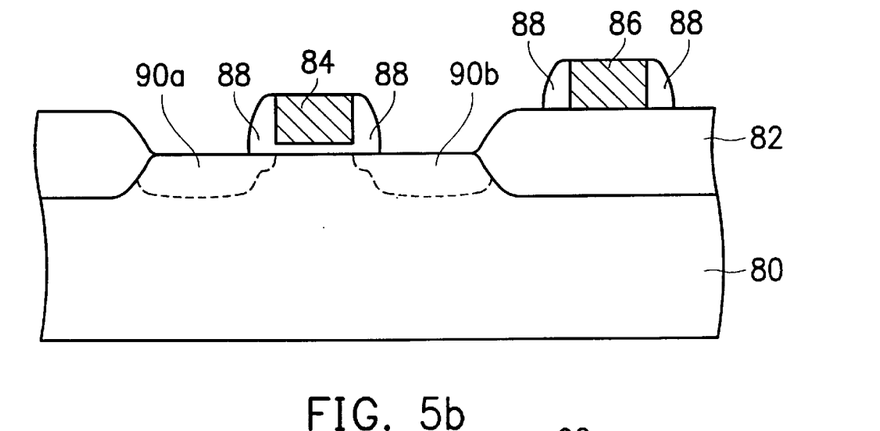
Figure 5C:
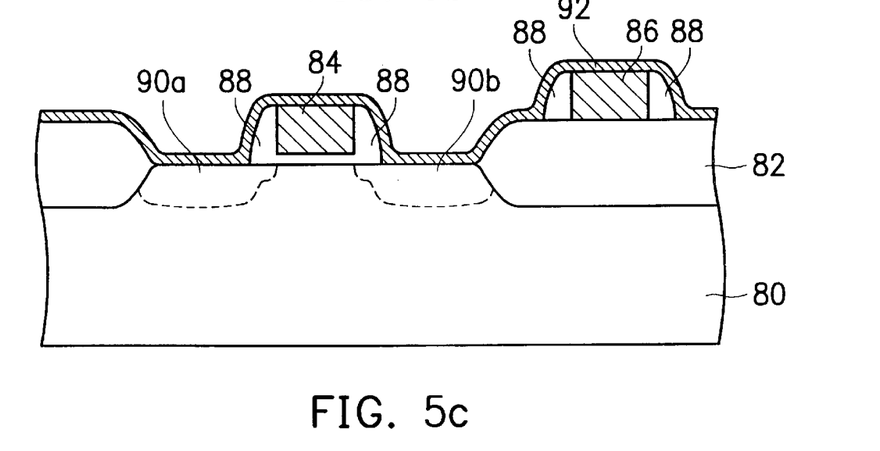
Figure 5D:
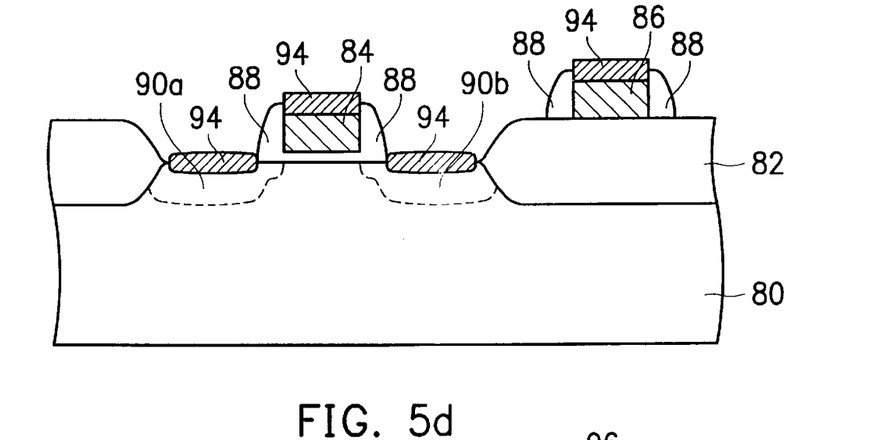
Figure 5E:
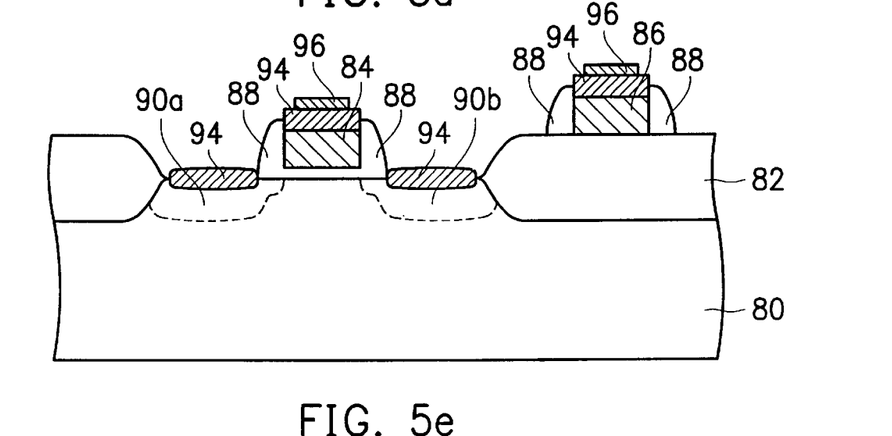
Figure 5F:
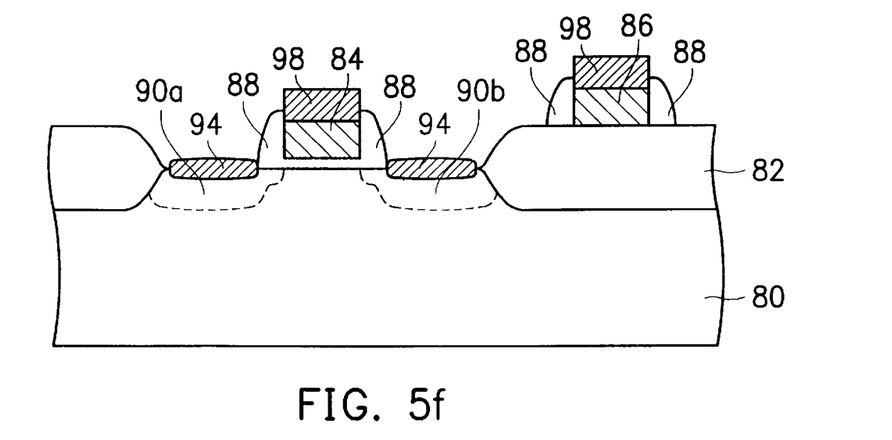

Another embodiment of the present invention of a process for forming self-aligned silicide involves sputtering a titanium layer after the conventional salicide processes. It uses the photo-mask in the previous embodiment to define and to pattern the titanium layer, so that the titanium layer is formed only on the polysilicon line and on the gate. Then, the reaction of the titanium and the silicon is activated to form a titanium silicide. As a result, a thicker silicide is formed on the gate and on the polysilicon line, so that the process is much easier for performing contact etching. This embodiment is described referring to FIG. 5a to FIG. 5f. Referring to FIG. 5a, a polysilicon layer is formed on substrate 80 having field oxide 82. The polysilicon layer patterned and etched using photo-resist layer 83 to define gate 84 of an device in an active region and polysilicon line 86 on field oxide 82. Next, referring to FIG. 5b, impurities are implanted to form an LDD structure and a non-conducting layer is deposited and etched back to form sidewall spacer 88 on the sides of polysilicon line 86 and gate 84. Impurities are then implanted to form source 90a and drain 90b on the sides of gate 84 in substrate 80. Referring to FIG. 5c, after implanting to form source 90a and drain 90b, titanium layer 92 is formed by sputtering and reacts with silicon to form salicide. Referring to FIG. 5d, the reaction of titanium layer 92 and silicon is activated by a thermal process, e.g. a RTP process, so that silicide 94 is formed on gate 84, polysilicon line 86 and in the active region. Then, unreacted metal is selectively etched away leaving only silicide 94. Referring to FIG. 5e, another titanium layer 96 is formed on the wafer by sputtering and the position of titanium layer 96 on gate 84 and on polysilicon line 86 is defined, like previous embodiment. Referring to FIG. 5f, the reaction of titanium and silicon is activated using a thermal process, e.g. a RTP process, so that a thickness of titanium silicide 98 on gate 84 and on polysilicon line 86 is greater than that in other regions.

On the above embodiments, a thicker silicide is formed on the gate and on the polysilicon line than that formed in the active region. As for the thickness of the silicide, the difference between the thickness of silicide on the polysilicon line/gate and that on the source/drain in the active region can range from 100 Å to 2000 Å.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to be best explain the principles of the invention and its practical applications, thereby enabling others skilled in the art to understand the invention to practice various other embodiments and make various modifications suited to the particular use contemplated. It is intended that the scope of the invention be defined by the following claims and their equivalents.

What is claimed is:

1. A process for forming self-aligned silicide, comprising the steps of:
   (a) forming a polysilicon layer on a substrate having a field oxide, patterning and etching the polysilicon layer using a photo-mask for defining a gate of a device in an active region and a polysilicon line on the field oxide;
   (b) implanting impurities into the substrate to form an LDD, depositing and etching back an insulating layer to form a sidewall spacer of the gate and the polysilicon line, and implanting to form a source and a drain on the side of the gate in the substrate;
   (c) after implanting to form the source and the drain, sputtering a first metal layer on the substrate;
   (d) patterning the first metal layer to define the gate and the polysilicon line using a mask with a sized pattern of the gate and the polysilicon line about 0.025 μm to prevent short circuiting caused by a misalignment of the photo-mask;
   (e) sputtering a second metal layer, so that the metal on the gate and on the polysilicon line is thicker than that on other regions; and
   (f) activating the reaction of metal of the first metal layer and of the second metal layer and silicon by a thermal process so that silicide is formed on the gate and in the active region, and the silicide on the gate and on the polysilicon line is thicker than the silicide on the source and on the drain in the active region, then selectively etching away unreacted metal of the first metal layer and of the second metal layer to leave only silicide.

2. The process for forming self-aligned silicide claimed as claim 1, wherein the metal of the first metal layer or of the second metal layer is titanium.

3. The process for forming self-aligned silicide claimed as claim 1, wherein the thermal process is a rapid thermal process.

4. The process for forming self-aligned silicide claimed as claim 1, further comprising a thermal process for reducing the sheet resistance of the silicide after forming a thicker silicide on the gate and the polysilicon line.

5. A process for forming self-aligned silicide, comprising the steps of:
   (a) forming a polysilicon layer on a substrate having a field oxide, then patterning and etching the polysilicon layer using a photo-mask to define a gate of a device in an active region and a polysilicon line on a field oxide;
   (b) implanting impurities into the substrate to form an LDD, then depositing and etching back an insulating layer to form a sidewall spacer of the gate and the polysilicon line, and implanting to form a source and a drain on the side of the gate in the substrate;
   (c) after implanting to form the source and the drain, sputtering a first metal layer which can react with silicon to form silicide;
   (d) activating the reaction of metal of the first metal layer and silicon by a thermal process so that a silicide is formed on the polysilicon line and in the active region, then selectively etching away unreacted metal of the first metal layer, and leaving only silicide;
   (e) sputtering a second metal layer, patterning the second metal layer on the gate and the polysilicon line using a mask with a sized pattern of the gate and the polysilicon about 0.025 μm to prevent short circuiting caused by a misalignment of the photo-mask; and
   (f) activating the reaction of metal of the second metal layer and silicon using a thermal process so that the silicide on the gate and on the polysilicon line is thicker than that on other regions.

6. The process for forming self-aligned silicide claimed as claim 5, wherein the metal of the first metal layer or of the second metal layer is titanium.

7. The process for forming self-aligned silicide claimed as claim 5, wherein the thermal process is a rapid thermal process.

8. The process for forming self-aligned silicide claimed as claim 5, further comprising a thermal process for reducing the sheet resistance of the silicide after forming a thicker silicide on the gate and the polysilicon line.

* * * * *